(12) United States Patent
Nozawa et al.

(10) Patent No.: US 12,289,933 B2
(45) Date of Patent: Apr. 29, 2025

(54) SEMICONDUCTOR LIGHT-EMITTING DEVICE AND MANUFACTURING METHOD OF THE SAME

(71) Applicant: STANLEY ELECTRIC CO., LTD., Tokyo (JP)

(72) Inventors: Sho Nozawa, Tokyo (JP); Yoichi Shimoda, Tokyo (JP); Daizo Kambara, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 526 days.

(21) Appl. No.: 17/846,602

(22) Filed: Jun. 22, 2022

(65) Prior Publication Data

US 2022/0416141 A1 Dec. 29, 2022

(30) Foreign Application Priority Data

Jun. 24, 2021 (JP) ................. 2021-104703

(51) Int. Cl.
| | |
|---|---|
| H10H 20/01 | (2025.01) |
| H10H 20/814 | (2025.01) |
| H10H 20/832 | (2025.01) |
| H10H 20/841 | (2025.01) |
| H10H 20/852 | (2025.01) |
| H10H 20/853 | (2025.01) |
| H10H 20/856 | (2025.01) |
| H10H 20/857 | (2025.01) |

(52) U.S. Cl.
CPC ...... *H10H 20/0362* (2025.01); *H10H 20/814* (2025.01); *H10H 20/835* (2025.01); *H10H 20/841* (2025.01); *H10H 20/852* (2025.01); *H10H 20/853* (2025.01); *H10H 20/856* (2025.01); *H10H 20/857* (2025.01)

(58) Field of Classification Search
None
See application file for complete search history.

(56) References Cited

U.S. PATENT DOCUMENTS

| | | |
|---|---|---|
| 2004/0089898 A1 | 5/2004 | Ruhnau et al. |
| 2018/0076368 A1* | 3/2018 | Hussell ............... H10H 20/857 |
| 2018/0375004 A1* | 12/2018 | Yamashita ......... H10D 30/0295 |

FOREIGN PATENT DOCUMENTS

JP 2004040099 A 2/2004

\* cited by examiner

*Primary Examiner* — Feifei Yeung Lopez
(74) *Attorney, Agent, or Firm* — Holtz, Holtz & Volek PC

(57) ABSTRACT

A light-emitting device includes a substrate provided with a first wiring and a second wiring, a first element including a first electrode pad, a second element including a second electrode pad, a first wire connecting the second wiring and the first electrode pad and including a first wire horizontal part that is level with respect to a top surface of the first element, a second wire connecting the second wiring and the second electrode pad and including a second wire horizontal part that is level with respect to the top surface of the first element, and a reflective resin exposing the top surface of the first element. The reflective resin has a bulged portion in a bulged dike shape such that a surface of the reflective resin is brought into contact with at least a part of the second wire horizontal part and extends along the second wire horizontal part.

9 Claims, 5 Drawing Sheets

SEMICONDUCTOR LIGHT-EMITTING DEVICE AND MANUFACTURING METHOD OF THE SAME

BACKGROUND OF THE INVENTION

1. Field of the Invention

The present invention relates to a light-emitting device and a manufacturing method of the light-emitting device.

2. Background Art

As a small-sized light-emitting device that uses a semiconductor light-emitting element, such as a Light Emitting Diode (LED), as a light source, a light-emitting device constituting of a plate-shaped mounting substrate, a light-emitting element disposed on the mounting substrate, and a sealing resin disposed so as to cover the light-emitting element is known.

For example, JP-A-2004-40099 discloses an optoelectronic element that includes a base casing provided with a cavity. In the cavity, the optoelectronic element also includes a semiconductor chip, such as a light-emitting diode chip, a bonding wire connecting a top surface of the semiconductor chip and a lead frame on a bottom surface of the cavity, and a filling material made of a reflective resin filled in the cavity. In the optoelectronic element disclosed in JP-A-2004-40099, a filling height of the filling material inside the cavity is lower than a height of a region (light-emitting region) in which a discharge and/or reception of the semiconductor chip is performed.

SUMMARY OF THE INVENTION

However, in the optoelectronic element disclosed in JP-A-2004-40099, a part of a support substrate of the semiconductor chip is exposed from the filling material. For example, in a case where the support substrate of the semiconductor chip is made of silicon or the like, when a light discharged from the semiconductor chip is guided to the support substrate, the light is absorbed in the support substrate and possibly causes a light-emitting efficiency of the optoelectronic element to decline.

Meanwhile, in a case where the filling material is filled such that the support substrate of the semiconductor chip is not exposed, the filling material sometimes climbs along the bonding wire and covers the light-emitting region in the top surface of the semiconductor chip, causing the light-emitting efficiency of the optoelectronic element to decline.

The present invention has been made in consideration of the above problems, and an object of the present invention is to provide a semiconductor light-emitting device that allows suppressing a decline of a light-emitting efficiency due to a light reflective resin covering a light-emitting surface of a light-emitting element, and a manufacturing method of the semiconductor light-emitting device.

A semiconductor light-emitting device according to the present invention includes a substrate, a first element, a second element, a first wire, a second wire, and a reflective resin. The substrate has a top surface and is provided with a cavity. The cavity has an opening in the top surface and has a rectangular-shaped bottom surface. The bottom surface is provided with a first wiring and a second wiring. The first wiring includes a first mounting portion and a second mounting portion. The first element is mounted on the first mounting portion and has a rectangular-shaped top surface. The first element includes a first electrode pad near a middle point of an element reference side as one of sides that define the top surface of the first element. The second element is mounted on the second mounting portion and has a top surface. The second element includes a second electrode pad on the top surface. The first wire connects the second wiring and the first electrode pad. The first wire includes a first wire horizontal part that is level with respect to the top surface of the first element. The second wire connects the second wiring and the second electrode pad. The second wire includes a second wire horizontal part that is level with respect to the top surface of the first element and has an approximately same height as the first wire horizontal part. The reflective resin having reflectivity is filled in the cavity so as to expose the top surface of the first element. The first mounting portion is disposed such that a mounting portion reference side and a cavity reference side opposed to the mounting portion reference side are separated by a first separation distance. The mounting portion reference side is one of sides that define an external shape of the first mounting portion in top view. The cavity reference side is one of sides that define the bottom surface of the cavity. The second wiring and the second mounting portion are disposed separately across a line segment in one region between the mounting portion reference side and the cavity reference side on the bottom surface of the cavity in top view. The line segment runs through a center point of a top surface of the first mounting portion and is perpendicular to the mounting portion reference side. The first element is a light-emitting element having a top surface as a light-exiting surface, and the first element is mounted on the first mounting portion such that the first electrode pad is near the one region side of the bottom surface of the cavity. The reflective resin has a bulged portion in a bulged dike shape such that a surface of the reflective resin is brought into contact with at least a part of the second wire horizontal part and extends along the second wire horizontal part.

A manufacturing method of a semiconductor light-emitting device includes: preparing a substrate having a top surface and provided with a cavity, the cavity having an opening in the top surface and having a rectangular-shaped bottom surface, the bottom surface being provided with a first wiring and a second wiring, the first wiring including a first mounting portion and a second mounting portion, the first mounting portion and the second mounting portion having a rectangular-shaped top surface; bonding a first element and a second element respectively onto the first mounting portion and the second mounting portion via a bonding layer, the first element having a rectangular-shaped top surface and including a first electrode pad near a middle point of an element reference side as one of sides that define the top surface of the first element, the second element including a second electrode pad on a top surface of the second element; connecting the second wiring and the first electrode pad with a first wire, and connecting the second wiring and the second electrode pad with a second wire; and filling the cavity with a reflective resin having reflectivity such that the top surface of the first element is exposed. The preparing includes disposing the first mounting portion such that a mounting portion reference side and a cavity reference side opposed to the mounting portion reference side are separated by a first separation distance, the mounting portion reference side is one of sides that define an external shape of the first mounting portion in top view, the cavity reference side is one of sides that define the bottom surface of the cavity in top view, the second wiring and the second mounting portion are disposed separately across a line segment in one region between the mounting portion reference side and the cavity reference side on the bottom surface of the cavity in top view, the line segment runs through a center point of a top surface of the first mounting portion and is perpendicular to the mounting portion reference side. The bonding includes mounting the first element on the first mounting portion such that the first electrode pad is near the one region side of the bottom surface of the cavity. The connecting includes forming the first wire so as to include a first wire horizontal part that is level with respect to the top surface of the first element, and forming the second wire so as to include a second wire horizontal part that is level with respect to the top surface of the first element and having an approximately same height as the first wire horizontal part. The filling includes causing a surface of the reflective resin to bulge to be brought into contact with at least a part of the second wire horizontal part, and forming a bulged portion in a dike shape extending along the second wire horizontal part.

DETAILED DESCRIPTION OF THE INVENTION

Figure 1:
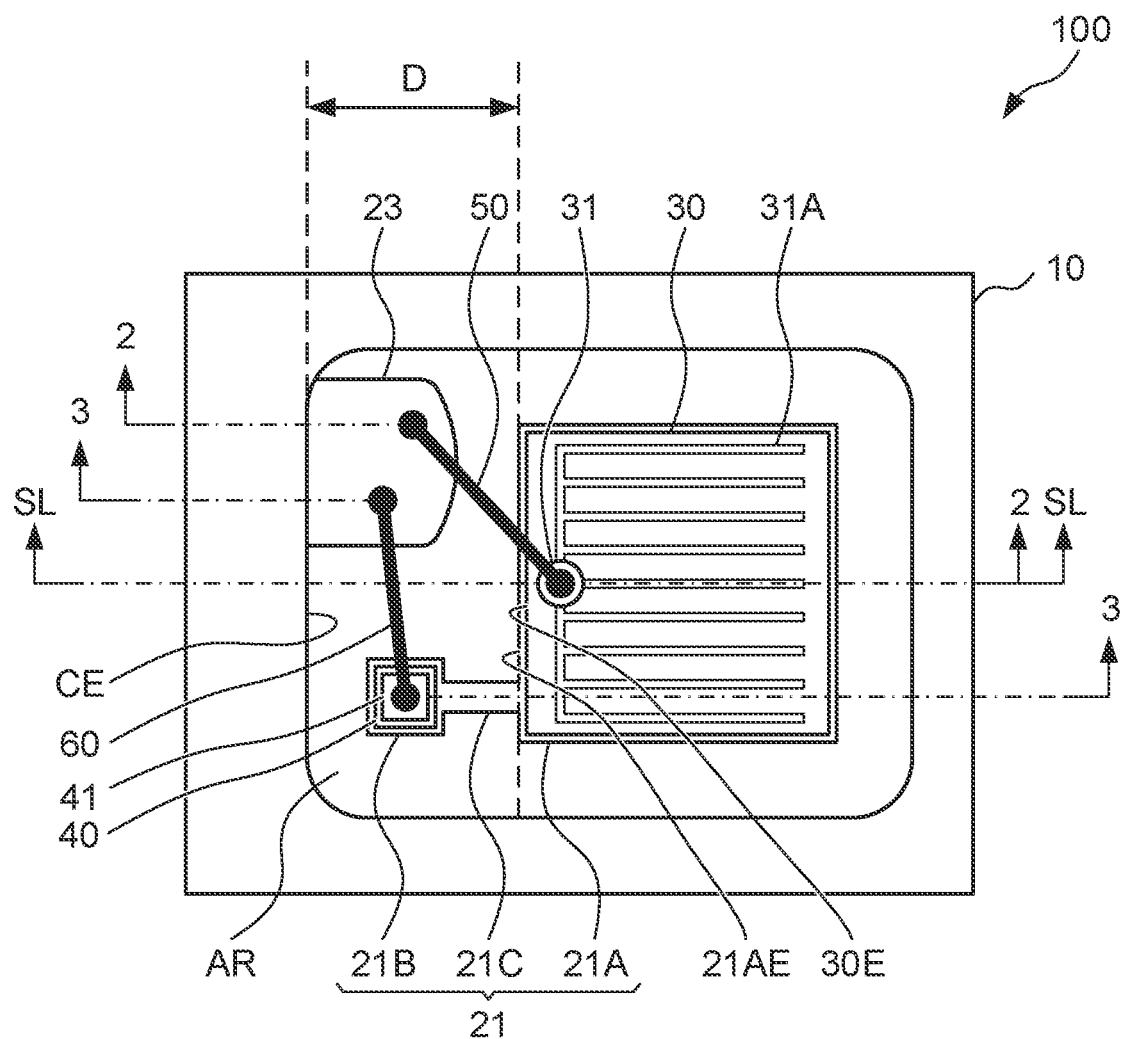
FIG. 1 is a top view of a light-emitting device according to an embodiment of the present invention.

Embodiments of the present invention will be described in detail below. Note that the same reference numerals are given to substantially identical or equivalent parts in the following embodiments and the accompanying drawings. In the following description, "material 1/material 2" indicates a stacked structure in which a material 2 is stacked on a material 1. In addition, "material 1-material 2" indicates an alloy of the materials 1 and 2.

Figure 2:
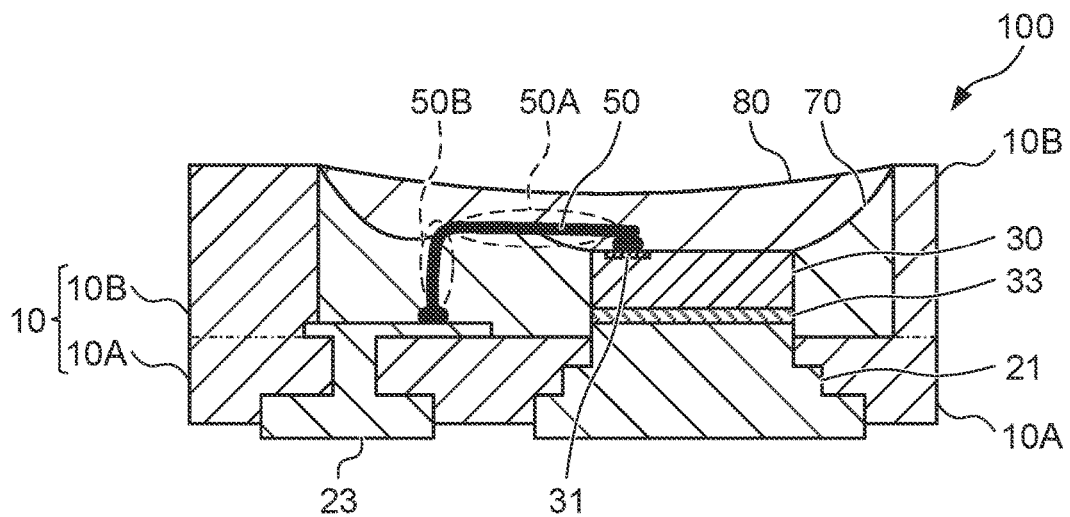
FIG. 2 is a cross-sectional view of the light-emitting device according to the embodiment of the present invention.
Figure 3:
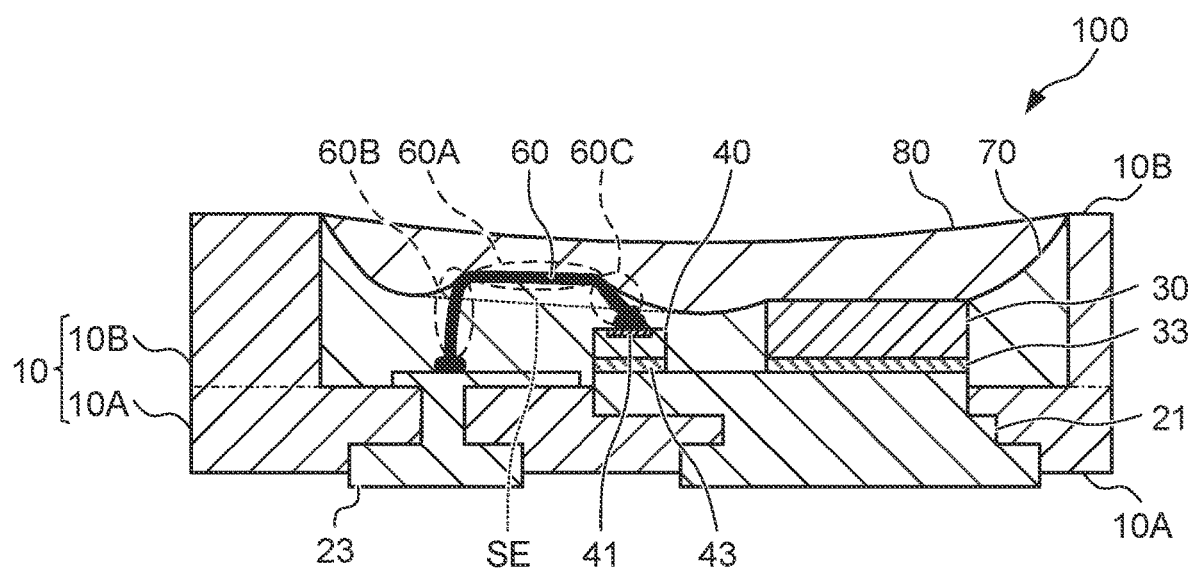
FIG. 3 is a cross-sectional view of the light-emitting device according to the embodiment of the present invention.
Figure 4:
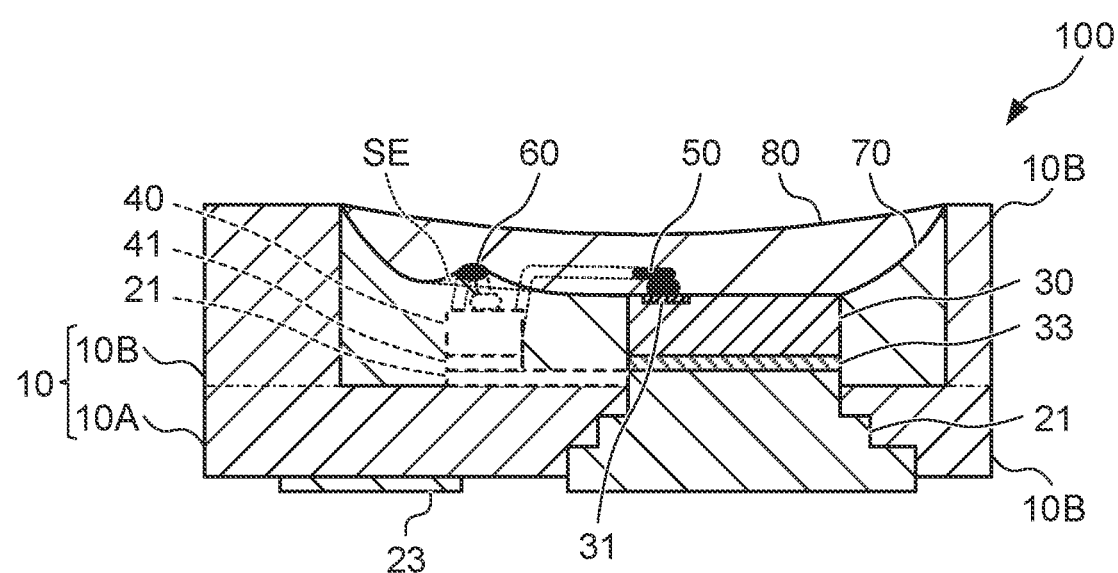
FIG. 4 is a cross-sectional view of the light-emitting device according to the embodiment of the present invention.

FIG. 1 is a top view of a light-emitting device 100. FIG. 2 is a cross-sectional view at the line 2-2 of the light-emitting device 100 in FIG. 1. FIG. 3 is a cross-sectional view at the line 3-3 of the light-emitting device 100 in FIG. 1. FIG. 4 is a cross-sectional view at the line SL-SL of the light-emitting device 100 in FIG. 1.

The light-emitting device 100 is a semiconductor light-emitting device that includes a substrate 10 provided with a cavity (recess) including a first wiring 21 and a second wiring 23 on its bottom surface, a light-emitting element 30 as a first element and a function element 40 as a second element both mounted on the first wiring 21, a first wire 50 connecting the light-emitting element 30 and the second wiring 23, a second wire 60 connecting the function element 40 and the second wiring 23, a reflective resin 70 filling the cavity, and a translucent resin 80 covering the reflective resin 70. In FIG. 1, the reflective resin 70 and the translucent resin 80 are not illustrated in order to show a structure inside the cavity of the substrate 10.

As illustrated in FIG. 1 and FIG. 2, the substrate 10 includes a flat plate portion 10A on which the first wiring 21 and the second wiring 23 having conductivity are disposed on one surface of a flat plate shape made by stacking a plurality of insulative base materials. The substrate 10 also includes a peripheral wall portion 10B having a wall surface (inner wall surface) surrounding the first wiring 21 and the second wiring 23 disposed on the flat plate portion 10A in a rectangular shape. Hereinafter, a surface of the flat plate portion 10A on a side including the peripheral wall portion 10B may be referred to as a top surface, and a surface on a side opposite to the top surface of the flat plate portion 10A may be referred to as a lower surface. In addition, the description will proceed hereinafter with an understanding that the top surface side of the flat plate portion 10A is upward of the light-emitting device 100, and the lower surface side of the flat plate portion 10A is downward of the light-emitting device 100. Accordingly, the substrate 10 is provided with a cavity (recess) defined by the top surface of the flat plate portion 10A and four wall surfaces of the peripheral wall portion 10B.

That is, a bottom surface of the cavity is the top surface of the flat plate portion 10A, and four side surfaces of the cavity are the four wall surfaces of the peripheral wall portion 10B.

The side surfaces of the cavity are formed inclined so as to be perpendicular or have obtuse angles with respect to the bottom surface of the cavity. That is, when the side surfaces of the cavity are perpendicular, the cavity has a rectangular parallelepiped shape. When the side surfaces of the cavity are inclined to have obtuse angles, the cavity has an inverted quadrangular pyramid shape. Furthermore, intersecting portions (corner portions) of mutually adjacent side surfaces of the cavity may have, for example, C-chamfered shapes made by the intersecting portions being chamfered so as to have obtuse angles, or R-chamfered shapes made by the intersecting portions being chamfered so as to be circular arcs. In this embodiment, the side surfaces of the cavity are perpendicular, and the intersecting portions have the R-chamfered shapes. Heights of the side surfaces of the cavity are uniform throughout the whole perimeter from the bottom surface of the cavity. Accordingly, the cavity has a quadrangular prism shape with R-chamfered corner portions, and the bottom surface of the cavity has a rectangular shape with rounded corner portions.

The flat plate portion 10A and the peripheral wall portion 10B of the substrate 10 may be, for example, an integrated body made by integral molding, or a bonded body made by bonding the flat plate portion 10A and the peripheral wall portion 10B.

The base material of the substrate 10 may be a thermosetting resin, such as epoxy resin (resin abbreviation: EP), silicone resin (SI), or bismaleimide-triazine (BT) resin, an oxide, such as alumina ($Al_2O_3$) or aluminum nitride (AlN), or a high thermal conductivity ceramic, such as nitride. The base material of the substrate 10 in this embodiment is an integrated body made by integral molding using BT resin.

The bottom surface of the cavity of the substrate 10 includes the first wiring 21 and the second wiring 23 disposed so as to be separated from one another. The first wiring 21 includes a first mounting portion 21A on which the light-emitting element 30 is mounted, a second mounting portion 21B on which the function element 40 is mounted, and a coupling portion 21C that couples the first mounting portion 21A and the second mounting portion 21B.

The first mounting portion 21A has a rectangular-shaped top surface on which the light-emitting element 30 is mountable. The first mounting portion 21A is disposed such that respective separation distances are provided between four sides that define the first mounting portion 21A and four opposing sides on the bottom surface of the cavity so as to arrange the four sides of the first mounting portion 21A parallel to and separated from the respective four opposing sides. The first mounting portion 21A is disposed such that one of the four separation distances is larger than the other three separation distances, and the respective other three separation distances are equal. Hereinafter, the one separation distance that is larger than the other three separation distances may be referred to as a first separation distance D. In addition, one side of the first mounting portion 21A and one side of the bottom surface of the cavity that are separated by the first separation distance D and opposed to one another may be referred to as a mounting portion reference side 21AE and a cavity reference side CE, respectively. In other words, the first mounting portion 21A of the light-emitting device 100 is disposed such that the mounting portion reference side 21AE as one of sides that define an external shape of the first mounting portion 21A and the cavity reference side CE opposed to the mounting portion reference side 21AE as one of sides of the bottom surface of the cavity in top view are separated by the first separation distance D.

The bottom surface of the cavity is provided with a bottom surface section AR (bottom surface portion of the cavity on the left side in FIG. 1) between the mounting portion reference side 21AE and the cavity reference side CE, that is, one region within a range of the first separation distance D from the cavity reference side CE.

The bottom surface section AR of the cavity is divided into two by a line segment SL (the line segment SL-SL in FIG. 1) that runs through the center point of a top surface of the first mounting portion 21A (the intersection point of diagonal lines on the top surface of the first mounting portion 21A) and is perpendicular to the mounting portion reference side 21AE.

That is, the bottom surface of the cavity is divided into one wide bottom surface section of the cavity in which the first mounting portion 21A that is farther from the cavity reference side CE than the first separation distance D is disposed and the bottom surface section AR within the first separation distance D from the cavity reference side CE. Further, the bottom surface section AR is divided into two narrow bottom surface sections of the cavity by the line segment SL. Accordingly, the bottom surface of the cavity is divided into three bottom surface sections of the cavity.

The second mounting portion 21B has a top surface shape on which the function element 40 is mountable. The second mounting portion 21B is disposed in one of the sections of the bottom surface section AR, which is divided into two by the line segment SL, of the cavity. The coupling portion 21C is disposed on the bottom surface of the cavity between the first mounting portion 21A and the second mounting portion 21B. The coupling portion 21C may be disposed in a middle layer of a multi-layer base material.

The second wiring 23 has a size that allows connecting the first wire 50 and the second wire 60. The second wiring 23 is disposed in another section that is different from the section in which the second mounting portion 21B is disposed, in the bottom surface section AR, which is divided into two by the line segment SL, of the cavity. In other words, the second wiring 23 and the second mounting portion 21B are disposed separately across the line segment SL that runs through the center point of the top surface of the first mounting portion 21A and is perpendicular to the mounting portion reference side 21AE, in the bottom surface section AR as one region between the mounting portion reference side 21AE and the cavity reference side CE on the bottom surface of the cavity in top view.

As illustrated in FIG. 2 and FIG. 3, a part of each the first wiring 21 and the second wiring 23 penetrates the flat plate portion 10A of the substrate 10, reaches the lower surface of the flat plate portion 10A, and is thus exposed. The portions exposed from the lower surface of the flat plate portion 10A of the first wiring 21 and the second wiring 23 function as mounting electrodes of the light-emitting device 100. The lower surface of the flat plate portion 10A is also the bottom surface of the light-emitting device 100.

The first wiring 21 and the second wiring 23 are made of a metal or an alloy that includes any of copper (Cu), aluminum (Al), and tungsten (W). The first wiring 21 and the second wiring 23 have respective portions exposed from each of the bottom surface of the cavity and the lower surface of the flat plate portion 10A, and metal films of nickel (Ni)/gold (Au) are stacked on the respective portions. An alloy including Cu is used for the first wiring 21 and the second wiring 23 in this embodiment.

The light-emitting element 30 as the first element is a Light Emitting Diode (LED). The light-emitting element 30 has a structure, for example, of a support substrate having a thickness of approximately 100 μm made of a conductive semiconductor, such as silicon (Si), and a light-emitting function layer having a thickness of approximately several μm constituting of a p-type semiconductor layer, a light-emitting layer, and an n-type semiconductor layer bonded to one side of the support substrate via a conductive reflecting electrode layer. Hereinafter, a surface of the support substrate to which the light-emitting function layer of the light-emitting element 30 is bonded may be referred to as a top surface of the light-emitting element 30, and a surface of the support substrate on a side opposite to the surface to which the light-emitting function layer is bonded may be referred to as a lower surface or the bottom surface of the light-emitting element 30. A surface of the light-emitting function layer on a side opposite to the reflecting electrode layer may be referred to as a top surface of the light-emitting function layer or a light-exiting surface of the light-emitting element 30.

The light-emitting function layer of the light-emitting element 30 is, for example, a III-V semiconductor crystal that emits infrared light from ultraviolet rays. In this embodiment, an orange to red light-emitting diode that emits a light at a wavelength of 580 nm to 640 nm was used as the light-emitting element 30.

As illustrated in FIG. 1, the light-emitting element 30 has a rectangular external shape defined by four sides (four side surfaces) in top view. Note that, the four sides in top view correspond to the four sides (side surfaces) of the support substrate of the light-emitting element 30. Furthermore, the light-emitting element 30 includes a first electrode pad 31 near the center part of one side that is one of the four sides. The first electrode pad 31 functions as a cathode electrode of the light-emitting element 30. In the description hereinafter, one side near the first electrode pad 31 of the light-emitting element 30 may be referred to as an element reference side 30E.

The light-emitting element 30 includes a comb-shaped wiring layer 31A made of a metal electrically connected to the first electrode pad 31 and disposed on the top surface of the light-emitting function layer. The wiring layer 31A has a function of equalizing amounts of currents flowing inside surfaces of the respective light-emitting function layers. An element protection film (not illustrated) of silicon oxide ($SiO_2$) and the like that opens so as to cover the top surface of the support substrate, the side surfaces and the top surface of the light-emitting function layer, and expose the first electrode pad 31 is formed in the light-emitting element 30.

The light-emitting element 30 includes a bonding electrode (not illustrated) on its bottom surface, which functions as an anode electrode of the light-emitting element 30. Note that, the first electrode pad 31 may be the anode electrode, and the bonding electrode provided in the bottom surface of the light-emitting element 30 may be the cathode electrode.

In the light-emitting element 30, the bonding electrode provided in the bottom surface and the first mounting portion 21A are bonded via a conductive bonding layer 33.

The light-emitting element 30 is mounted such that the element reference side 30E is in a direction along the mounting portion reference side 21AE of the first mounting portion 21A. In other words, the first electrode pad 31 is mounted so as to approach the bottom surface section AR as one region between the mounting portion reference side 21AE and the cavity reference side CE on the bottom surface of the cavity in top view.

The bottom surface of the light-emitting element 30 and the first mounting portion 21A have approximately the same sizes. That is, the element reference side 30E of the light-emitting element 30 and the mounting portion reference side 21AE of the first mounting portion 21A approximately correspond in top view.

The function element 40 as the second element is an element that operates so as to protect the light-emitting element 30 when an overvoltage is applied to the light-emitting element 30 from outside. As illustrated in FIG. 3, in the function element 40, a bonding electrode (not illustrated) provided on the bottom surface and the second mounting portion 21B are bonded via a conductive bonding layer 43. In addition, the function element 40 includes a second electrode pad 41 on its top surface, and the second electrode pad 41 and the second wiring 23 are electrically connected via the second wire 60.

Examples of the function element 40 include a zener diode, a condenser, and a varistor. In this embodiment, the zener diode is used as the function element 40. The function element 40 is disposed such that its top surface has a height equal to or lower than the height of the top surface of the light-emitting element 30. In a case where the function element 40 is unnecessary, an insulative dummy plate including the bonding electrode and the second electrode pad 41 can be used.

The bonding layer 33 is a conductive metal, and is capable of simultaneous energization when the light-emitting element 30 is bonded and fixed onto the first mounting portion 21A of the first wiring 21. Similarly, the bonding layer 43 is also a conductive metal, and is capable of simultaneous energization when the function element 40 is bonded and fixed onto the second mounting portion 21B on the first wiring 21.

As the bonding layers 33 and 43, a high temperature solder, a eutectic alloy, a silver paste, a gold bump, a nanoparticle sintered body and the like that do not melt can be used when the light-emitting device 100 is mounted to the mounting substrate. In this embodiment, a eutectic alloy made of gold tin (Au—Sn) is used as the bonding layers 33 and 43. By adjusting the thicknesses of the bonding layers 33 and 43, the heights of the top surfaces of the light-emitting element 30 and the function element 40 can be adjusted as well.

The first wire 50 electrically connects the first electrode pad 31 of the light-emitting element 30 and the second wiring 23. The second wire 60 electrically connects the second electrode pad 41 of the function element 40 and the second wiring 23. As the wires, a metal wire containing gold (Au), aluminum (Al), platinum (Pt), copper (Cu) and the like may be used. In this embodiment, an Au wire having a high reflectance with respect to a light at an orange to red wavelength band as the emitted light of the light-emitting element 30 was used.

As illustrated in FIG. 2, the first wire 50 includes a first wire rising part 50B of the wire that extends upward from a bonding portion of the second wiring 23, and a first wire horizontal part 50A that is level with respect to the top surface of the light-emitting element 30 and extends to the first electrode pad 31.

As illustrated in FIG. 1, the first wire rising part 50B is disposed in a region distant from the first electrode pad 31 of the second wiring 23, in top view. Therefore, the first wire horizontal part 50A can extend largely, and the reflective resin 70 described later climbing from the first wire rising part 50B to the first wire horizontal part 50A and covering the top surface (light-exiting surface) of the light-emitting element 30 can be suppressed. In top view, disposing the first wire rising part 50B in the region distant from the first electrode pad 31 of the second wiring 23 ensures the largely extended second wire horizontal part 60A of the second wire 60 as well.

The first wire horizontal part 50A is connected onto a metal bump disposed on the first electrode pad 31. The metal bump is formed by forming a free ball at a distal end of the wire used as the first wire 50, and bonding one or two of the free balls onto the first electrode pad 31. Accordingly, the first wire horizontal part 50A is mountable higher than the top surface of the light-emitting element 30, thus suppressing the reflective resin 70 from climbing from the first wire rising part 50B to the first wire horizontal part 50A and covering the top surface (light-exiting surface) of the light-emitting element 30. Furthermore, a damage of the light-emitting function layer caused by the first wire horizontal part 50A can be suppressed. Use of three or more metal bumps may possibly shield the light emitted from the light-emitting device 100 and decrease the light output, two or less metal bumps are preferred. In a case where the first electrode pad 31 is formed higher than the light-exiting surface of the light-emitting element 30, the metal bump may be omitted.

In a case where the first electrode pad 31 is formed as a rectangle in a region along the element reference side 30E of the light-emitting element 30, it is only necessary to connect a wire to a middle of the rectangular electrode pad or a side distant from the second wiring 23 such that the first wire horizontal part 50A extends long.

As illustrated in FIG. 3, the second wire 60 includes a second wire rising part 60B that extends upward from the bonding portion of the second wiring 23, a second wire horizontal part 60A that is level with respect to the top surface of the light-emitting element 30 and extends to near the second electrode pad 41 of the function element 40, and a second wire falling part 60C that heads toward the second electrode pad 41. In a case where a height of the top surface of the function element 40 is equal to the height of the top surface of the light-emitting element 30, the second wire falling part 60C may be omitted.

In top view, the second wire rising part 60B is preferably disposed at a position where a length of the second wire 60 in an extending direction is lengthened within a range that does not overlap with the first wire rising part 50B. Accordingly, the length of the second wire horizontal part 60A in the extending direction can be set long.

The second wire horizontal part 60A is preferably disposed at a height equal to that of the first wire horizontal part 50A, or higher by a diameter of the first wire 50. The second wire 60 is disposed such that the second wire horizontal part 60A crosses over the line segment SL in top view. In addition, the second wire 60 is disposed such that the second wire horizontal part 60A is disposed within a range of ⅓ to ⅔ of the first separation distance D from the cavity reference side CE in top view. In addition, the second wire 60 is disposed such that a length of the second wire horizontal part 60A in the extending direction is equal to or longer than ⅔ of the length of the element reference side 30E of the light-emitting element 30. Accordingly, when the reflective resin 70 is filled as described later, the second wire horizontal part 60A raises a surface of the reflective resin 70 to ensure forming a long bulged portion SE between the element reference side 30E and the cavity reference side CE.

As illustrated in FIG. 2 to FIG. 4, the reflective resin 70 is filled in the cavity of the substrate 10 so as to expose the top surface of the light-emitting element 30, and parts of the first wire horizontal part 50A and the second wire horizontal part 60A. In other words, the reflective resin 70 covers a top surface of the flat plate portion 10A (the bottom surface of the cavity) and the wall surfaces of the peripheral wall portion 10B (the side surfaces of the cavity) of the substrate 10, the function element 40, the side surfaces of the light-emitting element 30, a part of the first wire horizontal part 50A, and a part of the second wire horizontal part 60A.

As the reflective resin 70, for example, a light reflective resin in which a translucent resin containing any of a silicone resin, an epoxy resin, an acrylic resin, and a polycarbonate resin having translucency is used as a medium resin, and in which particles including any of titanium oxide ($TiO_2$) particles, zinc oxide (ZnO) particles, and alumina ($Al_2O_3$) particles having particle sizes of 200 nm to 300 nm are dispersed can be used. In this embodiment, a light-reflective thermosetting resin in which titanium oxide particles having a particle size of 200 nm to 300 nm are dispersed in a silicone resin was used.

As illustrated in FIG. 2, the reflective resin 70 embeds the first wire rising part 50B. The reflective resin 70 is filled in the cavity of the substrate 10 so as to expose a portion that includes a region where the first wire horizontal part 50A and the light-emitting element 30 overlap in top view.

As illustrated in FIG. 3 and FIG. 4, the reflective resin 70 embeds the second wire rising part 60B and the second wire falling part 60C. The reflective resin 70 forms a bulged portion SE that climbs up from the second wire rising part 60B and the second wire falling part 60C to the second wire horizontal part 60A, and is bulged such that the surface of the reflective resin 70 is brought into contact with the second wire horizontal part 60A.

As illustrated in FIG. 1 and FIG. 4, the bulged portion SE is formed along the extending direction of the second wire horizontal part 60A between the cavity reference side CE and the first wire horizontal part 50A. The bulged portion SE, which is formed in this manner, can suppress the uncured reflective resin 70 from climbing up to the first wire horizontal part 50A, and thus suppressing the top surface of the light-emitting element 30 from being covered by the reflective resin 70.

The reflective resin 70 has the surface in a curved shape in a concave form. Thus, the light emitted from the light-exiting surface of the light-emitting element 30 can be reflected in the opening direction of the cavity of the substrate 10.

The translucent resin 80 as the sealing resin covers and protects the surface of the reflective resin 70, the top surface of the light-emitting element 30 exposed from the reflective resin 70, and the exposed portions of the first wire 50 and the second wire 60.

The top surface of the translucent resin 80 functions as the light-exiting surface of the light-emitting device 100. The top surface of the translucent resin 80 has a curved surface that is recessed in a concave form from the upper end of the wall surfaces of the peripheral wall portion 10B of the substrate 10. The upper surface of the translucent resin 80 may also have a flat surface or a curved surface in a protruding form. In this embodiment, the top surface (front surface) of the translucent resin 80 has a curved surface in a concave form.

The translucent resin 80 is a resin that transmits a light emitted from the light-emitting element 30, and a translucent resin that contains, for example, any of a silicone resin, an epoxy resin, a polycarbonate resin, and an acrylic resin may be used. In this embodiment, a translucent silicone resin which is the same material as the medium of the reflective resin 70 is used as the translucent resin 80.

Thus, use of a resin of the same material can improve an adhesiveness of the reflective resin 70 and the translucent resin 80. In addition, allowing equalized stress acting on the portions embedded by the reflective resin 70 and the portions embedded by the translucent resin 80 of the first wire 50 and the second wire 60 can suppress, for example, wire damage, such as wire breakage.

The translucent resin 80 may also include phosphor particles, such as yttrium aluminum garnet (YAG), lutetium aluminum garnet (LuAG), α-Sialon, β-Sialon, and $CaAlSiN_3$(CASN) doped with a cerium (Ce) or europium (Eu) activator, and light scattering particles, such as alumina ($Al_2O_3$). For example, use of the light-emitting element 30 that emits a light at a wavelength of 380 nm to 460 nm and the phosphor particles allows the light-emitting device 100 to emit a white colored light in which the light emitted from the light-emitting element 30 and the light emitted from the phosphor are mixed.

As described above, approximately leveling the first wire horizontal part 50A of the light-emitting device 100 with respect to the top surface (light-exiting surface) of the light-emitting element 30 and connecting it to the first electrode pad 31, approximately leveling the second wire horizontal part 60A with respect to the top surface of the light-emitting element 30 and ensuring a height equal to or higher than the first wire horizontal part 50A, providing the second wire horizontal part 60A with the bulged portion SE bulged higher than the top surface of the reflective resin 70, and the like, the light-emitting device 100 in which the reflective resin 70 does not cover the top surface of the light-emitting element 30 in top view can be provided.

Next, a description will be given of a manufacturing method of the light-emitting device 100 according to the embodiment of the present application using FIG. 5 and FIG. 6.

Figure 5:
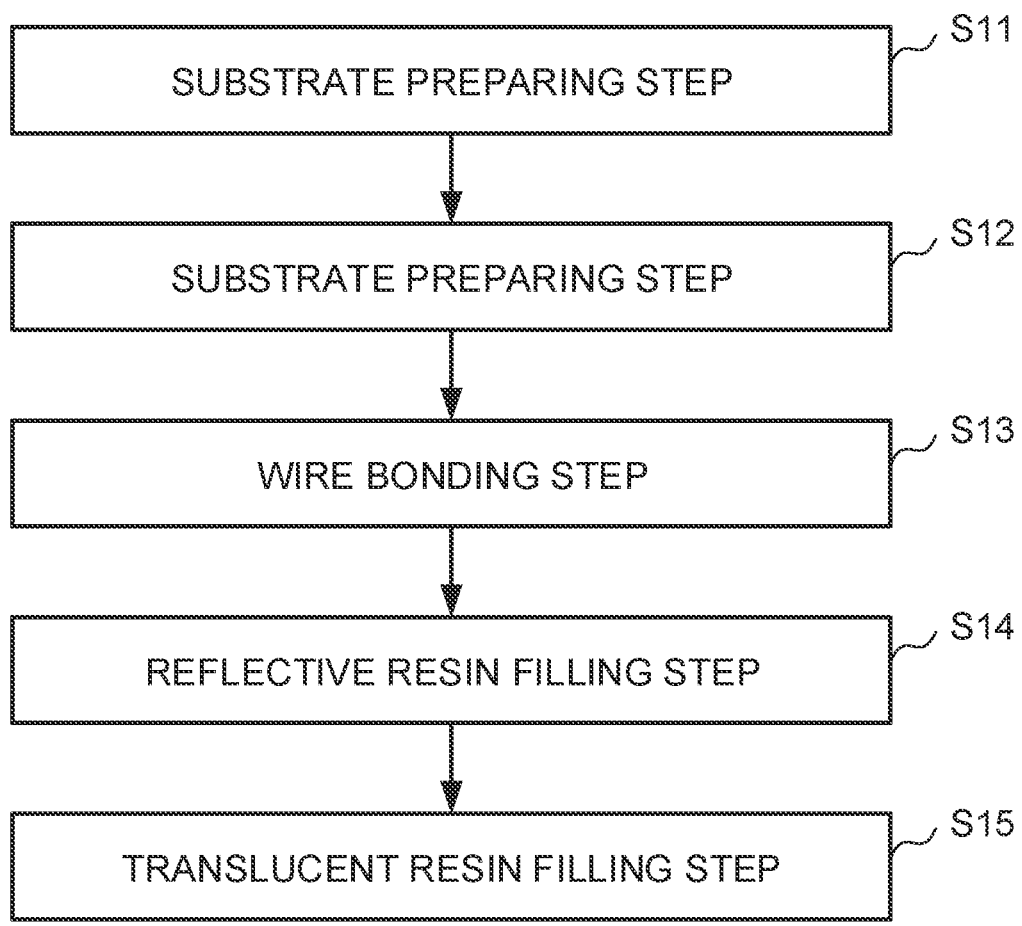
FIG. 5 is a flow chart describing a manufacturing process of the light-emitting device according to the embodiment of the present invention.

FIG. 5 is a flowchart describing a manufacturing process of the light-emitting device 100 according to the embodiment of the present invention. FIG. 6 is a top view of the light-emitting device 100 when Step S13 of the manufacturing process described in FIG. 5 is terminated.

First, as illustrated in FIGS. 1 to 4, a substrate preparing step of preparing the substrate 10 that includes a cavity having a rectangular-shaped bottom surface, the first wiring 21 including the first mounting portion 21A and the second mounting portion 21B each having a rectangular-shaped top surface on the bottom surface of the cavity, and the second wiring 23 is performed (Step S11). First, a prepreg sheet (green sheet) made of BT resin with a copper (Cu) foil attached on one surface of the sheet, and a prepreg sheet made of BT resin partly including through holes in which a copper material is embedded are created. Next, these created prepreg sheets are stacked in a predetermined order to form a plate material with the Cu foil attached to its surface by pressing and heating. Next, the Cu foil of the formed plate material is etched to form the first wiring 21 and the second wiring 23.

Next, the prepreg sheet made of BT resin having a rectangular-shaped opening so as to become the peripheral wall portion 10B is separately processed, stacked on the flat plate portion 10A on which the first wiring 21 and the second wiring 23 are formed, and integrated by heating and pressing to become a plate material with a cavity (recess).

Lastly, an Ni/Au plating was performed on the respective exposed surfaces of the first wiring 21 and the second wiring 23 to form the substrate 10.

Next, as illustrated in FIG. 1, an element mounting step of mounting the light-emitting element 30 and the function element 40 on the first mounting portion 21A and the second mounting portion 21B of the first wiring 21 via the bonding layers 33 and 43 is performed (Step S12). In this step, first, an Au—Sn solder paste made by mixing microparticles of an Au—Sn 20 wt % alloy and a flux that becomes the bonding layer 33 is applied over the top surface of the first mounting portion 21A. Next, the light-emitting element 30 is mounted such that an anode electrode at the lower surface of the light-emitting element 30 and the Au—Sn solder paste are brought into contact with one another. Note that, in this step, the light-emitting element 30 is mounted in a direction in which the first electrode pad 31 approaches the bottom surface section AR.

Subsequently, the Au—Sn solder paste is heated at approximately 300° C. to be melted and hardened, and the light-emitting element 30 is bonded onto the first mounting portion 21A by the bonding layer 33 made of Au—Sn alloy. Similarly, the function element 40 was bonded onto the second mounting portion 21B via the bonding layer 43.

In this embodiment, the first mounting portion 21A and the second mounting portion 21B respectively have approximately the same shapes as the bonding electrode of the light-emitting element 30 and the bonding electrode of the function element 40. Therefore, when the Au—Sn solder paste is melted, the light-emitting element 30 and the function element 40 are self-aligned on the first mounting portion 21A and the second mounting portion 21B. Note that, the heights of the light-emitting element 30 and the function element 40 can be adjusted by increasing or decreasing an amount of the Au—Sn solder paste.

Next, as illustrated in FIGS. 1 to 4, a wire bonding step of connecting the first electrode pad 31 of the light-emitting element 30 and the second electrode pad 41 of the function element 40 to the second wiring 23 respectively by the first wire 50 and the second wire 60 is performed (Step S13).

First, an Au bump is formed on each the first electrode pad 31 of the light-emitting element 30 and the second electrode pad 41 of the function element 40. Next, as illustrated in FIG. 2, the Au wire is bonded to a region distant from the first electrode pad 31 on the second wiring 23 and raised upward. Sequentially, the Au wire is bent and routed to be level with respect to the top surface (light-exiting surface) of the light-emitting element 30, and lastly, connected to the Au bump disposed on the first electrode pad 31. With the operation, the first wire rising part 50B and the first wire horizontal part 50A were formed on the first wire 50.

Next, as illustrated in FIG. 3, an Au wire is bonded to the bonding point of the second wiring 23 and raised upward. Sequentially, the Au wire is bent and routed to be level with respect to the top surface of the light-emitting element 30 and have the same height as that of the first wire horizontal part 50A. Further, the Au wire is bent again near the second electrode pad 41 of the function element 40 to be connected to the second electrode pad 41. With the operation, the second wire rising part 60B, the second wire horizontal part 60A, and the second wire falling part 60C were formed in the second wire 60.

The first wire 50 and the second wire 60 have the same wire diameters, and can be thin wires in a range where a power feeding resistance to the light-emitting element 30 is negligible. In this embodiment, the wire diameter is 00 μm. Note that, use of a plurality of wires allow the reduction in wire diameter.

The second wire horizontal part 60A can have the same height as the first wire horizontal part 50A or be higher by the wire diameter. When the second wire horizontal part 60A is too high, the climbing of the reflective resin 70 toward the second wire horizontal part 60A becomes insufficient and the bulged portion SE may possibly have a defect. In addition, when the second wire horizontal part 60A is too low, the second wire horizontal part 60A gets embedded in the reflective resin 70 and the bulged portion SE may possibly fail to be formed.

Next, a reflective resin filling step of filling the cavity disposed in the substrate 10 with the reflective resin 70 is performed (Step S14).

Figure 6:
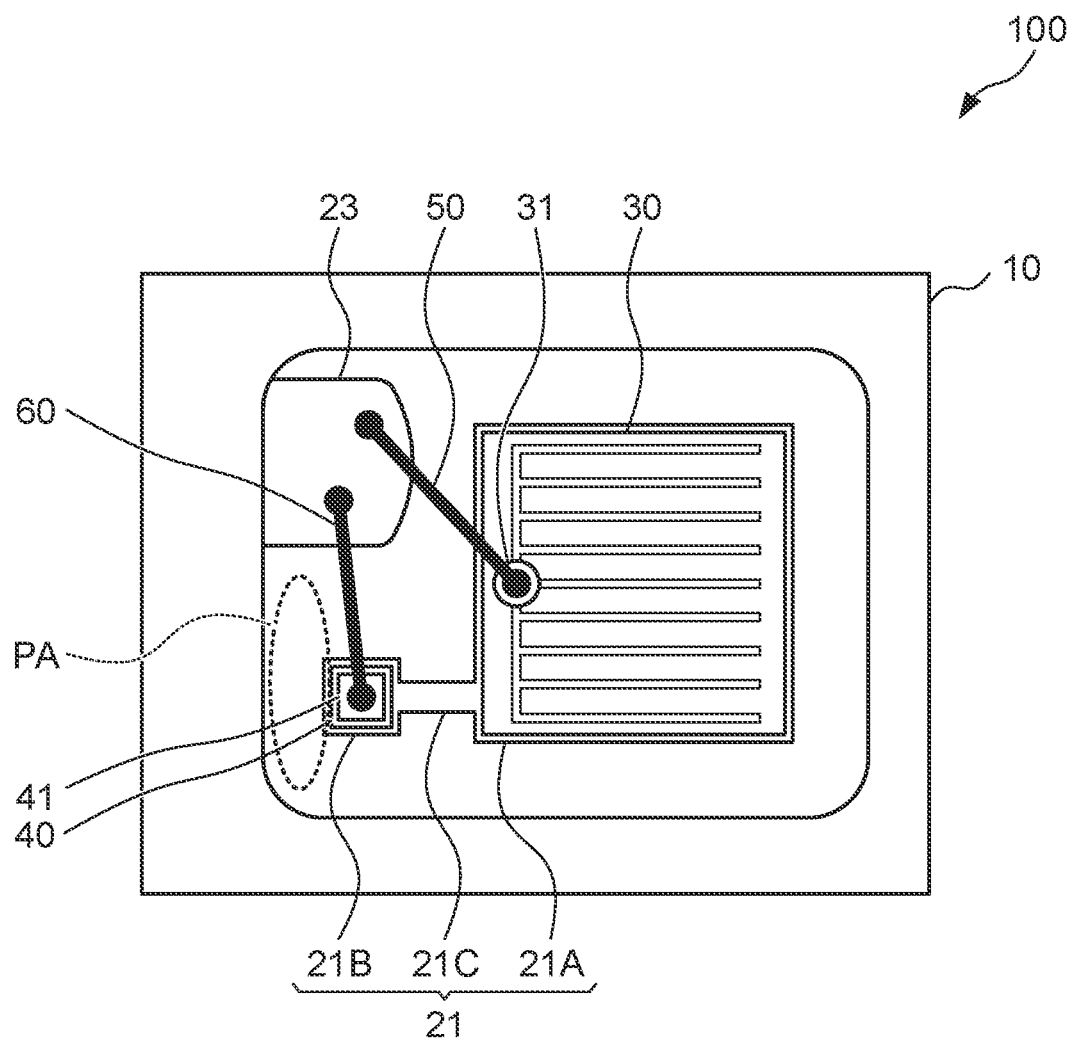
FIG. 6 is a top view at one step of manufacturing the light-emitting device according to the embodiment of the present invention.

First, as illustrated in FIG. 6, a filling of a fluid resin made of a silicone resin to be the reflective resin 70 in which titanium oxide particles are dispersed (hereinafter, may be referred to as a precursor resin) from the filling position PA indicated as a dashed line area between the second wire horizontal part 60A and a side of the cavity is started. The filling of the precursor resin is performed, after the precursor resin covers the bottom surface of the cavity, at a filling speed (discharge speed) that allows sequentially covering from downward toward the upper ends of the side surfaces of the light-emitting element 30. The filling is terminated when a surface (top surface) of the precursor resin reaches the upper ends of the side surfaces of the light-emitting element 30, and climbs up to the second wire horizontal part 60A to form the bulged portion SE.

By the precursor resin thus filled, the filling can be performed while the precursor resin sufficiently covers the side surfaces of the light-emitting element 30, and without the precursor resin climbing along the first wire horizontal part 50A and covering the top surface (light-exiting surface) of the light-emitting element 30. Subsequently, the precursor resin is heated at 150° C. for 15 minutes to be cured, and the reflective resin 70 including the bulged portion SE was formed.

In this step, by the precursor resin being filled from the filling position PA, the bulged portion SE is formed on the lower portion of the second wire horizontal part 60A before the filling of the precursor resin is terminated. At the end of the filling, the bulged portion SE serves as a dike that deflects the flow of the precursor resin toward an extending direction of the second wire horizontal part 60A. Due to the function, a flow of the precursor resin in a direction of the first wire horizontal part 50A is suppressed, and the precursor resin covering the top surface (light-exiting surface) of the light-emitting element 30 can be suppressed.

In addition, the bulged portion SE formed below the second wire horizontal part 60A functions as a damper portion where the bulged portion SE retains or supplies the precursor resin even when a filling amount of the precursor resin varies. Accordingly, the bulged portion SE can suppress a covering of the side surfaces of the light-emitting element 30 being insufficient when the precursor resin is filled.

Note that, the filling amount of the precursor resin is preferred to be an amount that allows the surface of the uncured reflective resin 70 to climb up to the second wire 60 and to be bulged, and the bulged portion SE to be formed without defect in the entire extending direction of the second wire horizontal part 60A.

In a case where the filling amount of the precursor resin is insufficient, the covering of the side surfaces of the light-emitting element 30 becomes insufficient and the light output of the light-emitting device 100 decreases. In this case, a defect or the like occurs in a retaining dike below the second wire horizontal part 60A.

In a case where the filling amount of the precursor resin is excessive, the reflective resin 70 covers the top surface (light-exiting surface) of the light-emitting element 30, and the optical output of the light-emitting device 100 decreases. In this case, a liquid surface of the precursor resin becomes higher than the second wire horizontal part 60A, and the bulged portion SE is no longer formed below the second wire horizontal part 60A. That is, the bulged portion SE formed below the second wire horizontal part 60A also functions as an indicator that indicates a proper filling amount of the precursor resin.

Next, as illustrated in FIG. 2 to FIG. 4, a translucent resin filling step of filling the translucent resin 80 having translucency on the top surface (front surface) of the reflective resin 70 is performed (Step S15). First, the translucent silicone resin that transmits a light emitted by the light-emitting element 30 is filled on a top surface (front surface) in a concave form of the reflective resin 70 by an amount that allows covering the surface of the reflective resin 70 and embedding the first and the second wires 50 and 60 exposed from the reflective resin 70. Subsequently, the substrate 10 was heated at 150° C. for 120 minutes to heat-cure the resin, thus forming the translucent resin 80.

Accordingly, the translucent resin 80 covers and protects the top surface of the light-emitting element 30 and the first and second wire horizontal parts 50A and 60A that are exposed from the reflective resin 70 with the translucent resin 80.

As described above, according to the manufacturing method including the substrate preparing step, the element bonding step, the wire bonding step, the reflective resin filling step, and the translucent resin filling step, the light-emitting device 100 in which the reflective resin 70 does not cover the top surface of the light-emitting element 30 in top view can be provided.

Note that, while the embodiments of the present invention have been described, these are displayed merely as examples, and the invention is does not limited to these.

For example, a light-emitting device in which a plurality of combinations of the first wiring 21 and the second wiring 23 are disposed on one flat plate portion 10A, and the peripheral wall portion 10B is disposed to a wiring portion of each of those combinations can be formed. In addition, a light-emitting device in which one cavity is provided with a plurality of combinations of the first wiring 21 and the second wiring 23, and the light-emitting element 30 and the function element 40 are mounted to each of those combinations can be formed. In addition, a light-emitting device in which each side surface of the cavity of the substrate 10 has a shape combining a perpendicular portion and an inclined portion can be formed.

Thus, the described embodiments are not intended to limit the scope of the invention. The described embodiments can be performed in other various forms, and various kinds of omissions, replacements, and changes are allowed without departing from the gist of the invention. Those modifications are included in the scope and gist of the invention as well as in the scope of the invention described in the scope of the patent claim and its equals.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2021-104703 filed on Jul. 24, 2021, the entire contents of which are incorporated herein by reference.

What is claimed is:
1. A semiconductor light-emitting device comprising:
a substrate having a top surface and provided with a cavity, the cavity having an opening in the top surface and having a rectangular-shaped bottom surface, the bottom surface being provided with a first wiring and a second wiring, the first wiring including a first mounting portion and a second mounting portion;
a first element mounted on the first mounting portion and having a rectangular-shaped top surface, the first element including a first electrode pad near a middle point of an element reference side as one of sides that define the top surface of the first element;
a second element mounted on the second mounting portion and having a top surface, the second element including a second electrode pad on the top surface;
a first wire connecting the second wiring and the first electrode pad, the first wire including a first wire horizontal part that is level with respect to the top surface of the first element;
a second wire connecting the second wiring and the second electrode pad, the second wire including a second wire horizontal part that is level with respect to the top surface of the first element and having an approximately same height as the first wire horizontal part; and
a reflective resin having reflectivity filled in the cavity so as to expose the top surface of the first element, wherein
the first mounting portion is disposed such that a mounting portion reference side and a cavity reference side opposed to the mounting portion reference side are separated by a first separation distance, the mounting portion reference side is one of sides that define an external shape of the first mounting portion in top view, the cavity reference side is one of sides that define the bottom surface of the cavity, the second wiring and the second mounting portion are disposed separately across a line segment in one region between the mounting portion reference side and the cavity reference side on the bottom surface of the cavity in top view, the line segment runs through a center point of a top surface of the first mounting portion and is perpendicular to the mounting portion reference side, the first element is a light-emitting element having a top surface as a light-exiting surface, and the first element is mounted on the first mounting portion such that the first electrode pad is near the one region side of the bottom surface of the cavity, and the reflective resin has a bulged portion in a bulged dike shape such that a surface of the reflective resin is brought into contact with at least a part of the second wire horizontal part and extends along the second wire horizontal part.

2. The semiconductor light-emitting device according to claim 1, wherein the second wire is disposed such that the second wire horizontal part crosses over the perpendicular line segment in top view.

3. The semiconductor light-emitting device according to claim 1, wherein the second wire horizontal part of the second wire is disposed within a range of ⅓ to ⅔ of the first separation distance from the cavity reference side in top view.

4. The semiconductor light-emitting device according to claim 1, wherein the second wire is formed such that a length of the second wire horizontal part in an extending direction is equal to or longer than ⅔ of a length of the element reference side of the first element.

5. The semiconductor light-emitting device according to claim 1, wherein the reflective resin is provided with the bulged portion in an entire extending direction of the second wire horizontal part.

6. The semiconductor light-emitting device according to claim 1, wherein the first wire horizontal part of the first wire has a forming range in a direction along the perpendicular line segment, the forming range is closer to the first element than a forming range of the second wire horizontal part.

7. The semiconductor light-emitting device according to claim 1, wherein the first electrode pad of the first element is provided with at least one metal bump, and the first wire is connected to the first electrode pad using at least one metal bump.

8. The semiconductor light-emitting device according to claim 1, further comprising a translucent sealing resin that covers the surface of the reflective resin, the top surface of the first element, and the first wire and the second wire.

9. A manufacturing method of a semiconductor light-emitting device, comprising:

preparing a substrate having a top surface and provided with a cavity, the cavity having an opening in the top surface and having a rectangular-shaped bottom surface, the bottom surface being provided with a first wiring and a second wiring, the first wiring including a first mounting portion and a second mounting portion, the first mounting portion and the second mounting portion having a rectangular-shaped top surface;

bonding a first element and a second element respectively onto the first mounting portion and the second mounting portion via a bonding layer, the first element having a rectangular-shaped top surface and including a first electrode pad near a middle point of an element reference side as one of sides that define the top surface of the first element, the second element including a second electrode pad on a top surface of the second element;

connecting the second wiring and the first electrode pad with a first wire, and connecting the second wiring and the second electrode pad with a second wire; and filling the cavity with a reflective resin having reflectivity such that the top surface of the first element is exposed, wherein the preparing includes disposing the first mounting portion such that a mounting portion reference side and a cavity reference side opposed to the mounting portion reference side are separated by a first separation distance, the mounting portion reference side is one of sides that define an external shape of the first mounting portion in top view, the cavity reference side is one of sides that define the bottom surface of the cavity in top view, the second wiring and the second mounting portion are disposed separately across a line segment in one region between the mounting portion reference side and the cavity reference side on the bottom surface of the cavity in top view, the line segment runs through a center point of a top surface of the first mounting portion and is perpendicular to the mounting portion reference side, the bonding includes mounting the first element on the first mounting portion such that the first electrode pad is near the one region side of the bottom surface of the cavity, the connecting includes forming the first wire so as to include a first wire horizontal part that is level with respect to the top surface of the first element, and forming the second wire so as to include a second wire horizontal part that is level with respect to the top surface of the first element and having an approximately same height as the first wire horizontal part, and the filling includes causing a surface of the reflective resin to bulge to be brought into contact with at least a part of the second wire horizontal part, and forming a bulged portion in a dike shape extending along the second wire horizontal part.

* * * * *